United States Patent [19]
Ngan

[11] Patent Number: 5,919,342
[45] Date of Patent: *Jul. 6, 1999

[54] METHOD FOR DEPOSITING GOLDEN TITANIUM NITRIDE

[75] Inventor: Kenny King-Tai Ngan, Fremont, Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/805,181

[22] Filed: Feb. 26, 1997

[51] Int. Cl.⁶ .................................................. C23C 14/34
[52] U.S. Cl. ................................. 204/192.22; 204/298.05
[58] Field of Search .................. 204/298.05, 192.22; 427/530, 126.1

[56] References Cited

U.S. PATENT DOCUMENTS

| | | | |
|---|---|---|---|
| 4,415,421 | 11/1983 | Sasanuma | 204/298.05 |
| 5,089,105 | 2/1992 | Tsutsui | 204/192.14 |
| 5,155,063 | 10/1992 | Ito | 437/190 |

FOREIGN PATENT DOCUMENTS

| | | | |
|---|---|---|---|
| 1954366 | 6/1971 | Germany | C23C 11/00 |
| 61-190070 | 8/1986 | Japan . | |

OTHER PUBLICATIONS

Skerlavaj et al, "Optimizing optical properties of reactively sputtered titanium nitride films", Thin Solid Films, vol. 186 No. 1, Apr. 1, 1990, pp. 15–26.

*Primary Examiner*—Roy V. King
*Attorney, Agent, or Firm*—Birgit E. Morris

[57] ABSTRACT

Golden TiN films having uniform sheet resistance are deposited from a plasma sputtering chamber by initially saturating the chamber with nitrogen using high nitrogen gas flow rates and then reducing the nitrogen gas flow rates and reducing the pressure in the chamber during the deposition step.

3 Claims, 3 Drawing Sheets

METHOD FOR DEPOSITING GOLDEN TITANIUM NITRIDE

This invention relates to an improved process for sputter depositing "golden" titanium nitride (TiN), a term used for a particular crystal orientation. More particularly, this invention relates to depositing golden TiN at low pressure to provide TiN films of improved sheet resistance uniformity.

BACKGROUND OF THE INVENTION

TiN is employed as a barrier material to prevent spiking of aluminum lines into a silicon substrate. TiN is generally deposited by sputtering in a PVD chamber. FIG. 1 illustrates a conventional sputtering chamber 10. A target 12, made of the material to be sputter deposited, Ti in this instance, is connected to a source of DC power 14. A substrate support electrode 16 is mounted so as to be spaced from and parallel to the target 12, and bears a substrate 18 thereon which is to be coated. A pair of magnets 20, 20' are mounted behind the target 12 and a gas inlet 22 permits one or more gases to be fed to the chamber. A gas exhaust system 24 comprising a gas outlet and a vacuum pump permits evacuation of the chamber 10 to the desired pressure, which is generally below about 20 millitorr.

During sputtering, the power is initiated and inert gas molecules, such as of argon, are fed to the chamber. When TiN is to be deposited, a mixture of argon and nitrogen gases is fed to the chamber. The argon gas molecules are attracted to the target by the DC power 14, and bombard the target 12, sputtering off particles of target material which can deposit on the substrate 18. However, since particles of target material are sputtered in all random directions, the bottom coverage of TiN films in high aspect ratio vias/contacts is very low.

In order to improve bottom coverage, a modified sputtering chamber as shown in FIG. 2 has been proposed. In FIG. 2, a chamber 170 includes a target 172, a substrate support 174 mounted spaced from and opposite to the target 172. A source of DC power 180 is connected to the target 172 and a gas inlet 197 permits entry of inert and reaction gases stored in vessels 192 and 194 respectively. Flow meters 196 and 198 monitor the gas flow rates. The chamber 170 also includes an internal helical coil 186 connected to an RF power source 188. This coil 186, when activated, forms a high density plasma region between the target 172 and the substrate support 174. Metal particles sputtered from the target 172 pass through this plasma region and become ionized. These positively charged metal ions are attracted to the negatively biased substrate support 174 (through power source 182), improving the deposition rate onto the substrate 175. In a preferred embodiment, the helical coil 186 is made of the same material as the target 172, so that any particles that become sputtered from the coil 186 will be of the same material as that of the target 172 and the deposited film will not be contaminated with other materials.

A vacuum pump 190 connected to an exhaust line 191 maintains the desired pressure in the chamber 170. Generally a pressure of about 30 millitorr is used to sputter titanium for example in the presence of nitrogen to form golden TiN.

If the vacuum pump 190, generally a cryogenic pump, is fitted with an adjustable gate valve 199, the pressure in the chamber can be adjusted by varying the speed of the pump. If the gate valve is fully open, the chamber pressure remains low, at about 10 millitorr. However, this pressure is too low to provide sufficient metal ionization in the plasma region. Thus if the pumping speed is decreased, a higher pressure can be maintained in the chamber for adequate ionization of the metal particles.

FIG. 3 illustrates a hysteresis plot of chamber pressure in millitorr versus flow rates in sccm for an argon flow rate of 25 sccm to a chamber as in FIG. 2 operated at a power of 5 kW DC and 2.5 kW RF and a substrate temperature of 200° C. In order to obtain TiN under such conditions, a nitrogen flow rate of over 55 sccm is required. However, such a high nitrogen flow rate increases the chamber pressure to about 35–38 millitorr. Because of gas scattering effects at such high pressures, the sheet resistance of TiN has a poor uniformity.

FIG. 4 is a contour plot of sheet resistance of the TiN film deposited at 38 millitorr pressure. The uniformity is quite poor, about 18%, 1 sigma.

Thus it would be highly desirable to be able to deposit TiN at low pressures of about 25 millitorr and lower. In accordance with the process of the invention, the pumping speed to the chamber is increased to reduce the pressure in the chamber.

SUMMARY OF THE INVENTION

A golden TiN film having uniform sheet resistance can be deposited at high deposition rates by depositing TiN at low pressure of about 25 millitorr and lower. In accordance with the process of the invention, the pumping speed of the chamber is increased to reduce the pressure in the chamber, argon and nitrogen are first passed into the chamber at a high nitrogen flow rate with respect to the argon flow rate for at least five seconds, and then the nitrogen flow rate is reduced while maintaining formation of TiN.

DETAILED DESCRIPTION OF THE INVENTION

In order to improve the sheet resistance uniformity of sputtered nitrided titanium films in a plasma sputtering chamber, the chamber is operated initially at a high pressure using high nitrogen gas flow rates for a short period of time, and then the nitrogen gas flow rate is reduced while maintaining the deposition of TiN.

Figure 5:
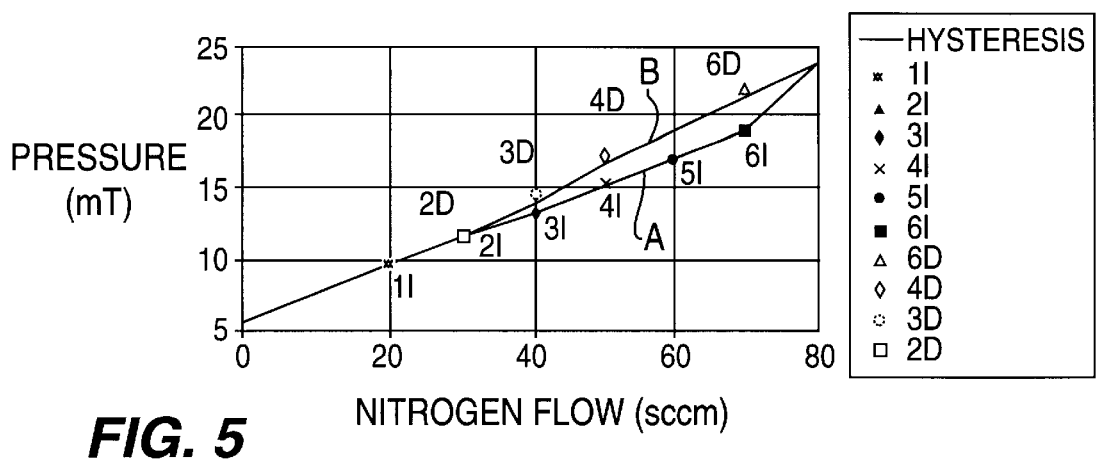
FIG. 5 is a hysteresis curve obtained using the process of the invention for sputter depositing TiN at low pressure.

FIG. 5 is a hysteresis curve of pressure versus nitrogen gas flow rates using 5 kW of DC power, 2.5 kW of RF power, argon flow rates of 15 sccm and a substrate temperature of 200° C.

Referring to FIG. 5, is can be seen from curve A that the pressure in the chamber generally rises as the nitrogen flow rate rises, but that nitrogen is not fully taken up by Ti until the nitrogen flow rate approaches 65 sccm. Curve B shows that as nitrogen gas flow rates and pressure are reduced, TiN can still be produced at a pressure as low as 13 millitorr (within the hysteresis curves A and B).

Figure 3:
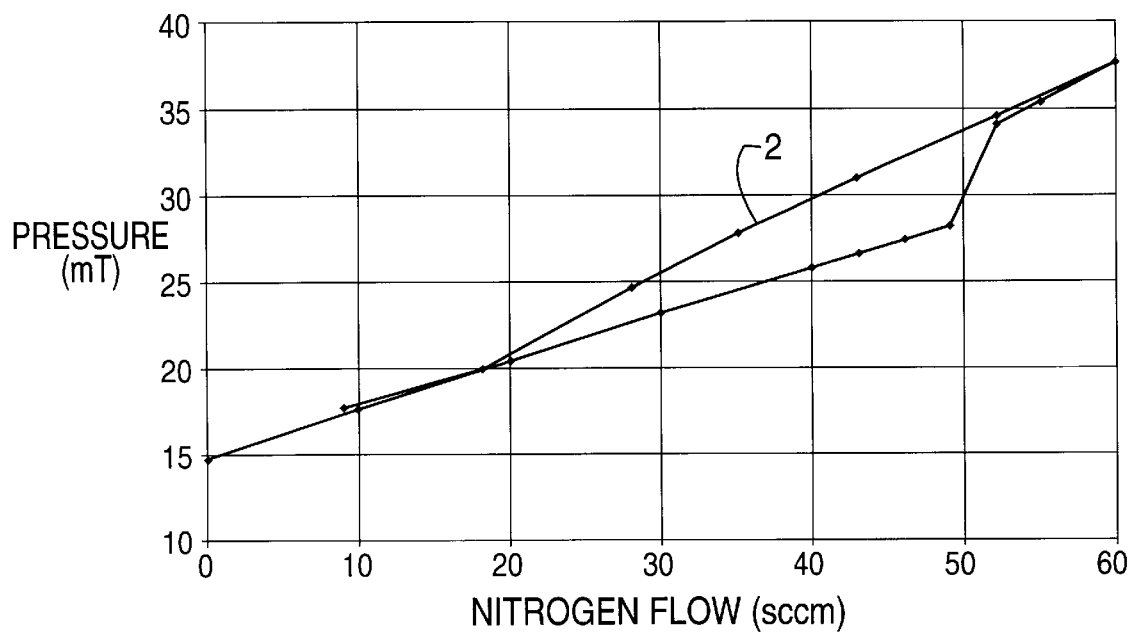
FIG. 3 is a hysteresis curve obtained using a prior art process for sputter depositing TiN at a pressure of 38 millitorr.
Figure 4:
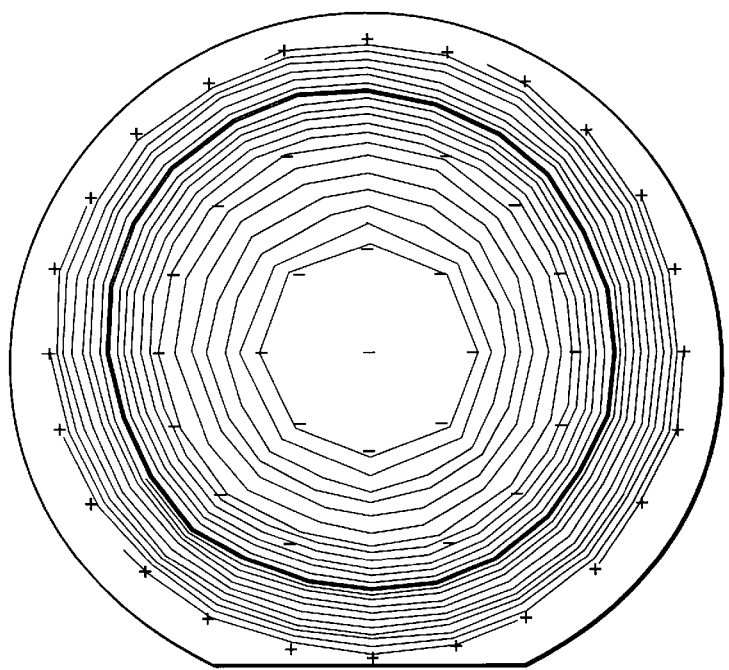
FIG. 4 is a contour plot of sheet resistance of TiN deposited on a substrate in accordance with the prior art.

Thus in order to produce TiN at a lower pressure, when the sheet resistance uniformity of the deposited film will be improved, in accordance with the invention a high nitrogen gas flow is passed into the chamber initially to fill the chamber with nitrogen. The nitrogen gas flow rate is then reduced, when the pressure is also reduced. Referring to FIG. 5, the TiN hysteresis plot using a low argon flow rate of 15 sccm and the given sputtering parameters which are the same as for FIG. 3, TiN can be formed at pressures as low as about 13 millitorr when nitrogen gas flow rates are high.

Figure 6:
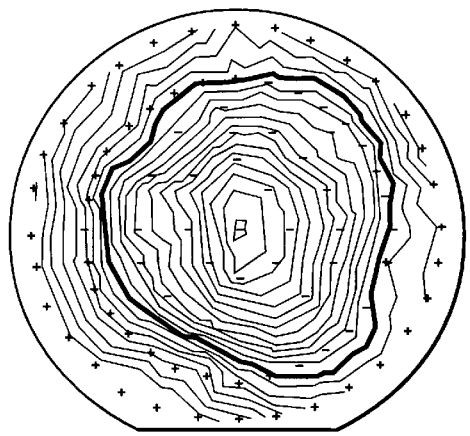
FIG. 6 is a contour plot of sheet resistance of TiN deposited in accordance with the invention.

FIG. 6 is a contour map of sheet resistance uniformity of a film deposited at 15 millitorr, at 5 kW of DC power, 2.5 kW of RF power with −85 volts bias at the substrate support. The sheet resistance uniformity is excellent, varying by only 6%, 1 sigma.

Figure 7:
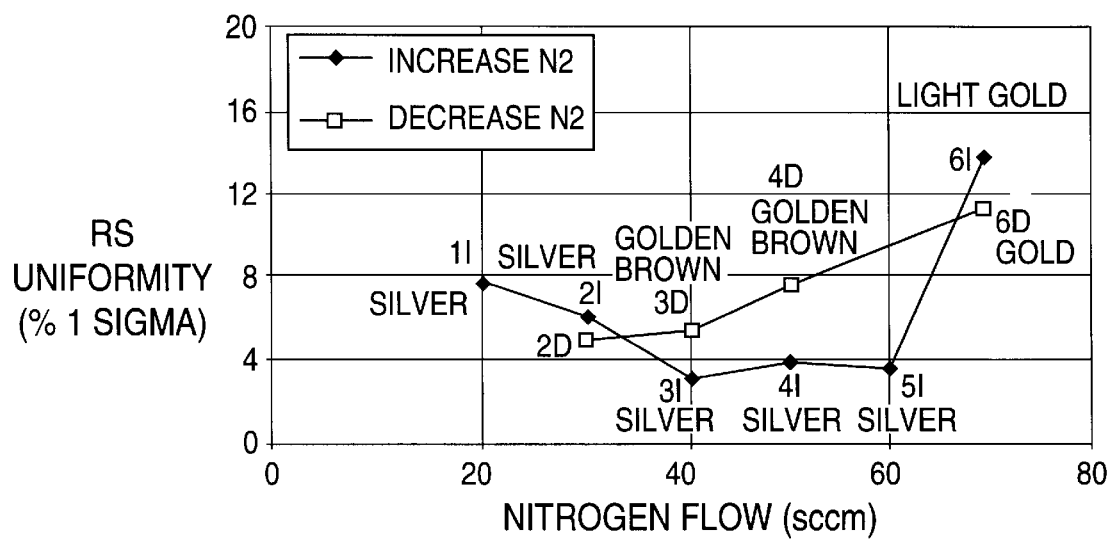
FIG. 7 is a graph of sheet resistance uniformity in percent, 1 sigma versus nitrogen gas flow rate in sccm.

FIG. 7 is a graph of sheet resistance uniformity versus nitrogen flow rate. In order to obtain golden TiN, nitrogen gas flow rates should be about 40–70 sccm. Golden TiN can be formed at nitrogen gas flow rates between 40 and 70 sccm to produce sheet resistance uniformity ranging between about 5 and 14%.

Thus it is apparent that by careful choice of nitrogen gas flow rates and pressure, golden TiN films having very uniform sheet resistance uniformity can be obtained.

The invention will be further illustrated by the following example, but the invention is not meant to be limited to the details described therein.

EXAMPLE

Figure 1:
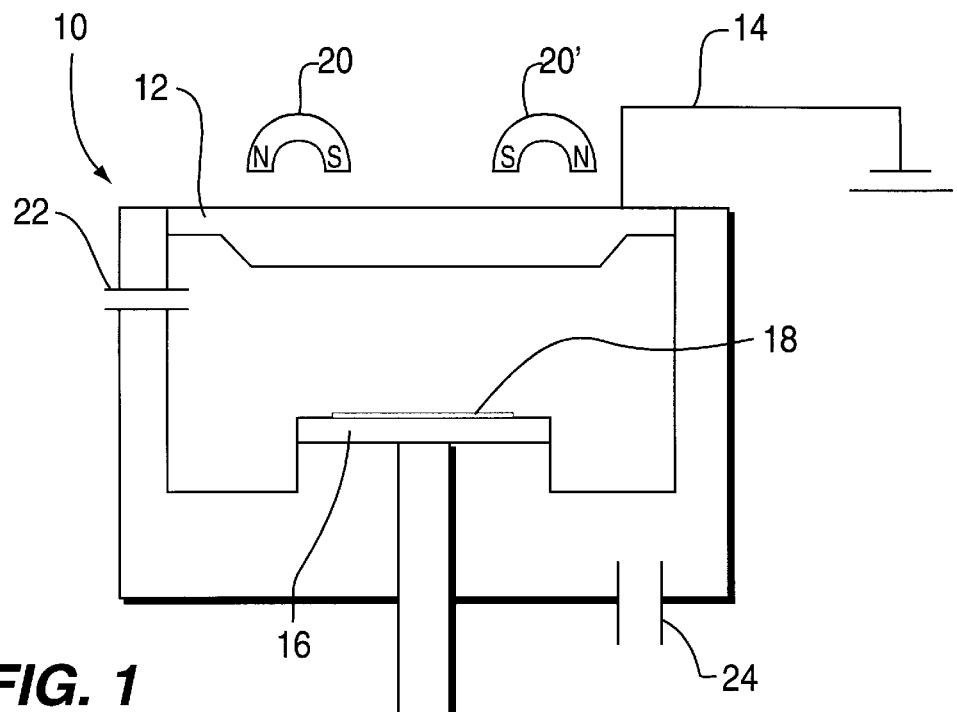
FIG. 1 is a schematic cross sectional view of a conventional sputtering chamber.
Figure 2:
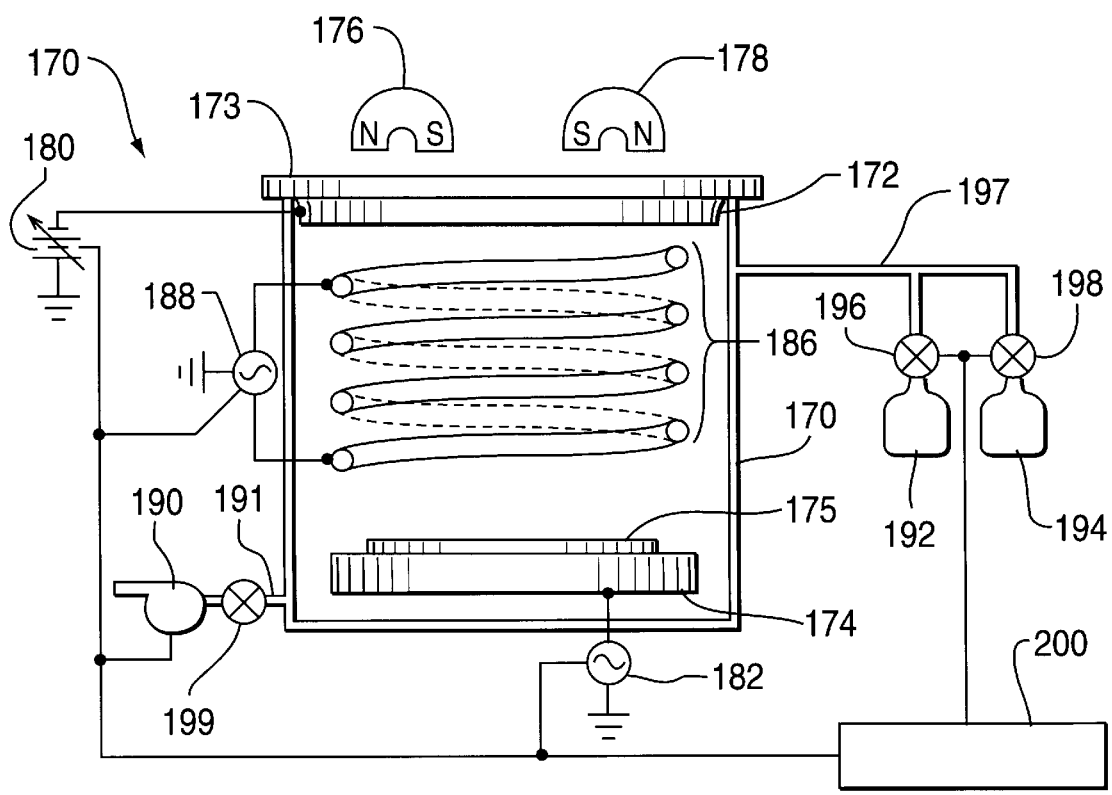
FIG. 2 is a schematic cross sectional view of a modified sputtering chamber that produces a plasma in the chamber.

Using a sputtering chamber as in FIG. 2, a sequence of operating parameters was employed to deposit golden TiN in accordance with the invention.

Initially, to stabilize the gases in the chamber, the chamber was operated under the following conditions: gate valve mid position; 0 DC power, 0 RF power, 15 sccm of argon and 80 sccm of nitrogen were passed into the chamber for 10 seconds.

In step 1, the DC target power of 5 kW, 2.5 kW of RF power to the coil, the gate valve position and the gas flow rates were maintained for 5 seconds to saturate the chamber with nitrogen.

In step 2, the nitrogen gas flow rate was reduced to 40 sccm, other parameters remaining the same, and sputtering was continued until the desired thickness of TiN was deposited.

All power and gases were then shut off and the gate valve opened to its fully open position to pump out the chamber for a subsequent deposition.

Although the invention has been described in terms of specific embodiments, the invention is not to be so limited. The scope of the invention is to be limited only by the scope of the appended claims.

I claim:

1. A method of depositing golden TiN having uniform sheet resistance in a plasma sputtering chamber including a titanium target connected to a source of DC power, a substrate support electrode mounted spaced from and parallel to the target, an internal helical coil connected to a source of RF power, a gas inlet and an adjustable exhaust system, comprising a) powering the target electrode and the helical coil and saturating the chamber with nitrogen at a high nitrogen gas flow rate thereby creating an initial pressure in the chamber of from about 35 to about 38 millitorr, and b) depositing golden TiN wherein, during deposition, the nitrogen gas flow rate is reduced, and the chamber pressure is reduced to within the range from 13 millitorr to about 25 millitorr by increasing the exhaust pump pumping speed.

2. A method according to claim 1 wherein the nitrogen gas flow rate initially is about 80 sccm and is reduced to about 40 sccm during the deposition step.

3. A method according to claim 1 wherein the chamber pressure is reduced to about 15 millitorr during the deposition step.

* * * * *